(12) United States Patent  
Smith

(10) Patent No.: US 7,911,800 B2  
(45) Date of Patent: Mar. 22, 2011

(54) HOUSING FOR ELECTRICAL APPARATUS

(75) Inventor: Mark Andrew Smith, Steeton Keighley (GB)

(73) Assignee: Pace, Pic, West Yorkshire (GB)

( * ) Notice: Subject to any disclaimer, the term of this patent is extended or adjusted under 35 U.S.C. 154(b) by 91 days.

(21) Appl. No.: 10/559,314

(22) PCT Filed: May 24, 2004

(86) PCT No.: PCT/GB2004/002228
§ 371 (c)(1),
(2), (4) Date: Apr. 6, 2006

(87) PCT Pub. No.: WO2004/107835
PCT Pub. Date: Dec. 9, 2004

(65) Prior Publication Data
US 2006/0223363 A1    Oct. 5, 2006

(30) Foreign Application Priority Data

Jun. 3, 2003  (GB) .................................. 0312666.1

(51) Int. Cl.
*H05K 5/00*      (2006.01)
(52) U.S. Cl. ........ 361/752; 361/690; 361/727; 361/730; 361/785; 174/559; 174/656; 174/660; 174/666
(58) Field of Classification Search .................. 361/752, 361/687, 690, 727, 730, 785; 174/656, 666, 174/559, 660
See application file for complete search history.

(56) References Cited

U.S. PATENT DOCUMENTS

| 4,813,885 | A | * | 3/1989 | Colleran et al. .............. 439/565 |
| 5,243,493 | A | | 9/1993 | Jeng et al. |
| 5,469,844 | A | | 11/1995 | Rogler et al. |
| 5,659,151 | A | * | 8/1997 | Dale .............................. 174/666 |
| 5,802,459 | A | * | 9/1998 | Burke et al. ................. 455/90.3 |
| 5,895,906 | A | * | 4/1999 | Danielson et al. ........ 235/462.45 |
| 6,018,765 | A | * | 1/2000 | Durana et al. ................ 709/217 |
| 6,059,385 | A | * | 5/2000 | Guhl .......................... 312/223.2 |
| 6,155,180 | A | * | 12/2000 | Clark ......................... 108/50.02 |
| 6,445,407 | B1 | * | 9/2002 | Wright ........................... 348/51 |
| 6,538,904 | B1 | * | 3/2003 | Isely et al. .................... 361/826 |
| 6,788,786 | B1 | * | 9/2004 | Kessler et al. ........... 379/413.04 |
| 2002/0061676 | A1 | * | 5/2002 | Kameyama et al. .......... 439/404 |
| 2002/0113530 | A1 | * | 8/2002 | Hatch et al. ................ 312/223.3 |
| 2004/0109295 | A1 | * | 6/2004 | Major et al. .................. 361/752 |
| 2005/0168955 | A1 | * | 8/2005 | Karasawa et al. ............ 361/730 |

FOREIGN PATENT DOCUMENTS

EP  0340444  11/1989
GB  2333649  7/1999

* cited by examiner

*Primary Examiner* — Dean A. Reichard
*Assistant Examiner* — Xiaoliang Chen
(74) *Attorney, Agent, or Firm* — Chinh H. Pham; Greenberg Traurig, LLP

(57) ABSTRACT

Electrical apparatus is provided including a housing for containing one or more electrical components therein. The housing has at least one connector means (29) for allowing the connection of at least one electrical cable thereto. Channel means (28) are provided adjacent the connector means for containing at least a part of the electrical cable adjacent a connection end thereof which is to be connected to the connector means on the housing in use.

12 Claims, 3 Drawing Sheets

HOUSING FOR ELECTRICAL APPARATUS

Figure 1:
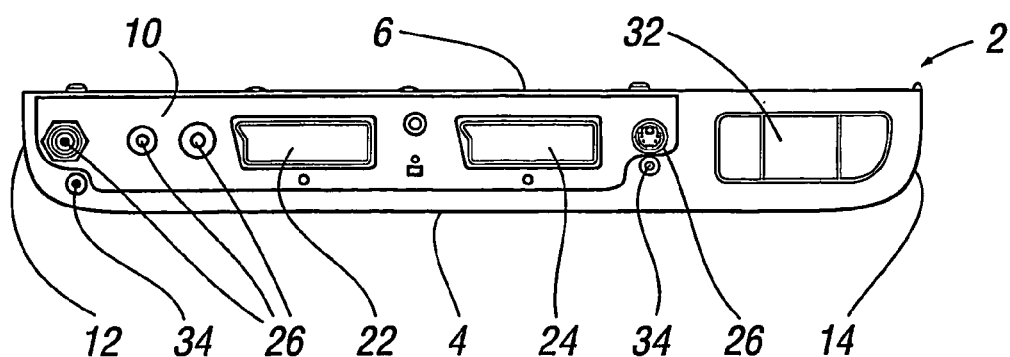

This invention relates to electrical apparatus, and particularly to an improved housing for electrical apparatus.

Although the following description refers almost exclusively to a housing for use with electrical apparatus in the form of a broadcast data receiver (BDR), it will be appreciated by persons skilled in the art that the present invention can be used with any electrical apparatus, such as DVD players, video players, computers and/or the like.

Broadcast Data Receivers, often referred to as Set Top Boxes, receive digital data broadcast from a remote location and decode and process the data to provide video, audio and/or auxiliary data for display on a display screen and/or for listening to via speakers. The speakers and/or display screen can form part of the BDR but often they are provided separate to and connected to the BDR. As such, the BDR typically has a number of electrical cables attached thereto, such as an electrical power lead connecting the BDR to a mains power supply, an electrical cable connecting the BDR to a television display screen, an electrical cable connecting the BDR to speakers and/or further electrical cables connecting the BDR to other apparatus or systems, such as a computer, telephone, joystick, keyboard, cable network, aerial, satellite receiver and/or the like. A rear panel of the BDR is conventionally provided with a plurality of connection means, such as electrical sockets, for the connection of the electrical cables thereto.

There is increasing pressure on manufacturers to produce smaller and more compact items of electrical apparatus, thereby reducing the cost associated with materials, increasing the ease with which the apparatus can be transported, increasing the aesthetic appearance of the apparatus and making the apparatus more discrete in a home or office environment. However, the dimensions of a BDR are limited, at least in part, by the number of connection means provided on the rear panel of the housing. In addition, the plurality of cables typically connected to the BDR and the plurality of connection means on the BDR are generally unsightly and reduce the aesthetic appeal of the apparatus to a user. Furthermore, electrical cables are often provided in a length substantially greater than the length required to connect the BDR to a further item of apparatus, network or power supply. As such, coils of excess cable are often visible adjacent the apparatus which is also unsightly.

It is therefore an aim of the present invention to provide electrical apparatus, and particularly a housing for electrical apparatus, which provides the apparatus with an improved appearance when of one or more electrical cables are connected therewith.

It is a further aim of the present invention to provide electrical apparatus having smaller dimensions than conventional apparatus whilst allowing the same to form the required number of connections via electrical cables to other items of apparatus, networks or an electrical power supply.

According to a first aspect of the present invention there is provided electrical apparatus, said electrical apparatus including a housing for containing one or more electrical components therein, said housing having at least one connector means for allowing the connection of at least one electrical cable thereto and wherein the housing is provided with channel means adjacent said connector means for containing at least a part of the electrical cable which is to be connected to said connector means on the housing in use.

The channel means typically limits or prevents a user's view of the at least one connector means and/or electrical cable, thereby providing the electrical apparatus with an improved and neater appearance. For example, any excess length of electrical cable can be stored in the channel means to prevent the cable causing an obstruction or looking unsightly. In addition, the channel means protects at least the portion of the cable adjacent a connection end thereof from damage caused by dust and dirt and/or other objects which might be accidentally located thereon.

Preferably the part of the electrical cable adjacent a connection end thereof is located in said channel means.

In one embodiment the channel means is in the form of at least one channel defined in a member, such as a frame member or housing member, and said member can be attached to the main housing of the electrical apparatus. In one example, the member can be detachably attached to the housing to allow easy removal thereof, thereby allowing the connector means to be accessed for replacement, repair and/or to allow the electrical cable to be attached to the connector means. The attachment means can include any or any combination of adhesive, welding, one or more screws, nuts and bolts, clips, complementary engagement means, such as a complementary channel/protrusion arrangement and/or the like.

In one embodiment the channel means is in the form of at least one channel defined between the member and the housing of the electrical apparatus. Thus, for example, the member can be in the form of an extension portion having a channel portion defined therein, the extension portion being attached to and extending from a part of the housing of the electrical apparatus.

Alternatively, the extension portion can define a channel between one or more walls of the housing of the apparatus and one or more walls of the extension portion.

In an alternative embodiment the channel means is in the form of at least one channel defined in a portion of the housing. The channel means can be integrally formed with the housing or partition means can be provided and said channel means can be defined between said partition means and/or said partition means and one or more walls of said housing.

The channel means, in one example, includes a top wall, at least one end wall and at least one side wall. A base wall can also be provided if required.

Further preferably the channel means has two end walls, one wall at either end of a channel defined therein.

Preferably at least one aperture or recess is defined in a wall of the channel means (i.e. the portion of the housing or member attached to the housing) to allow the cables to enter/exit the same. The aperture(s) or recess(es) is/are of such dimensions to allow connection means provided on the end of the electrical cable, such as a plug, socket and/or the like to be passed therethrough.

The walls of the housing are preferably provided to be substantially continuous, planar and/or flush with one or more adjacent walls of the channel defining member attached to the housing when fitted.

Preferably the housing has one or more connection means provided on at least two sides and/or ends thereof. The channel means can be provided adjacent one or more of the sides and/or ends of the housing having the connection means. By providing connection means on more than one side or end of the housing, the housing can have smaller dimensions and is not limited in size by the dimensions of the rear connection panel as is conventionally the case. Currently, if connection means were to be provided on more than one side or end of the housing, the cables and connection means would become mote visible to a user, which is undesirable. The channel means of the present invention allows connection means to be provided on more than one side of the housing whilst hiding the same from view.

In a preferred embodiment the housing of the electrical apparatus has front and rear ends walls, side walls and a conventional panel with one or more connection means provided on the rear end wall thereof. In addition, one or more further connection means are provided on at least one side of the housing and channel means is provided adjacent said at least one side.

Preferably the electrical apparatus is a broadcast data receiver (BDR).

Preferably one or more vents, slots or apertures are provided in the channel means to allow air to circulate therethrough, thereby preventing the electrical cables stored or supported therein to overheat.

The housing of the apparatus can be provided in two or more parts and the channel means can be attached to or integrally formed with at least one of said housing parts. For example, the base and rear end walls can be provided as one part of the housing and the top, front end wall and side walls can be provided as a second part of the housing.

According to a second aspect of the present invention there is provided a housing for electrical apparatus, said housing for containing one or more electrical components therein for the operation of said electrical apparatus, said housing having at least one connector means for connection of at least one electrical cable thereto and wherein the housing is provided with channel means adjacent said connector means for containing at least a part of an electrical cable which is to be connected to said connector means in the housing in use.

According to a further independent aspect of the present invention there is provided a member defining at least one channel therein for attachment to a housing of electrical apparatus.

The electrical cables typically include connection means at either end thereof. The connection means on the electrical cables are typically in the form of a plug and/or socket arrangement.

Figure 2:
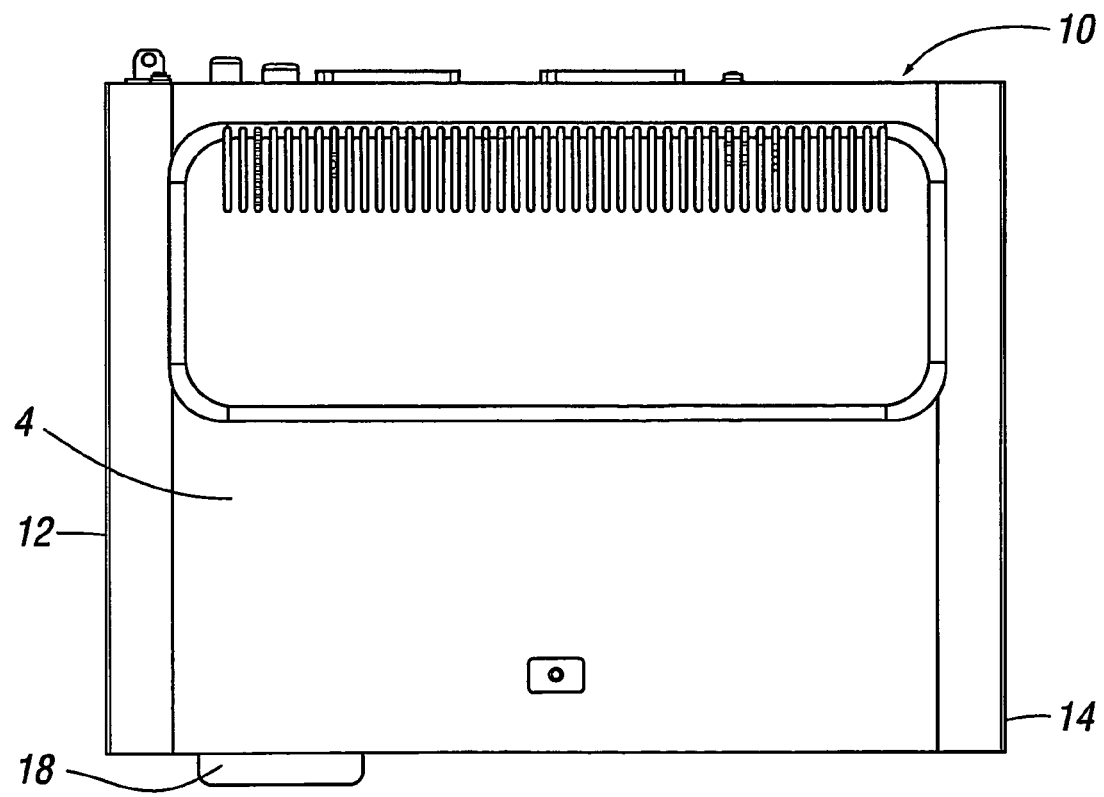
Figure 3:
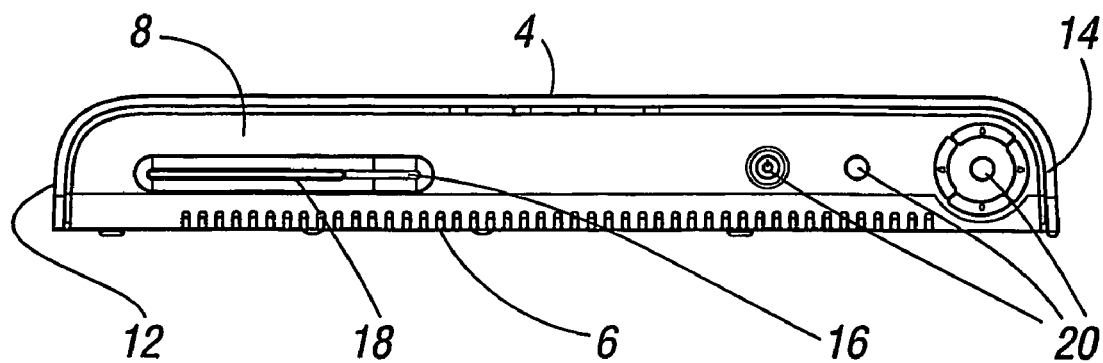
Figure 4:
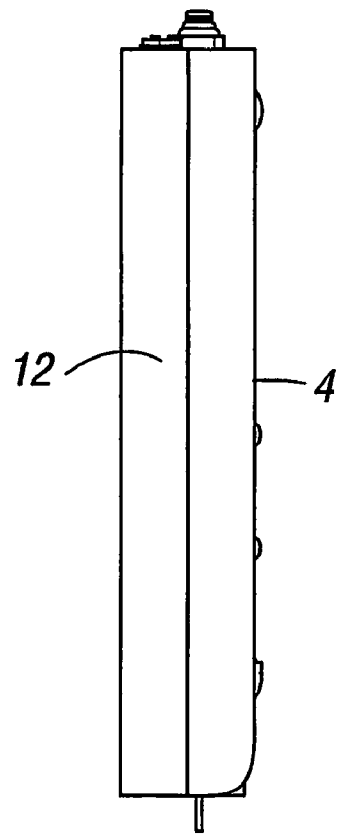
Figure 5:
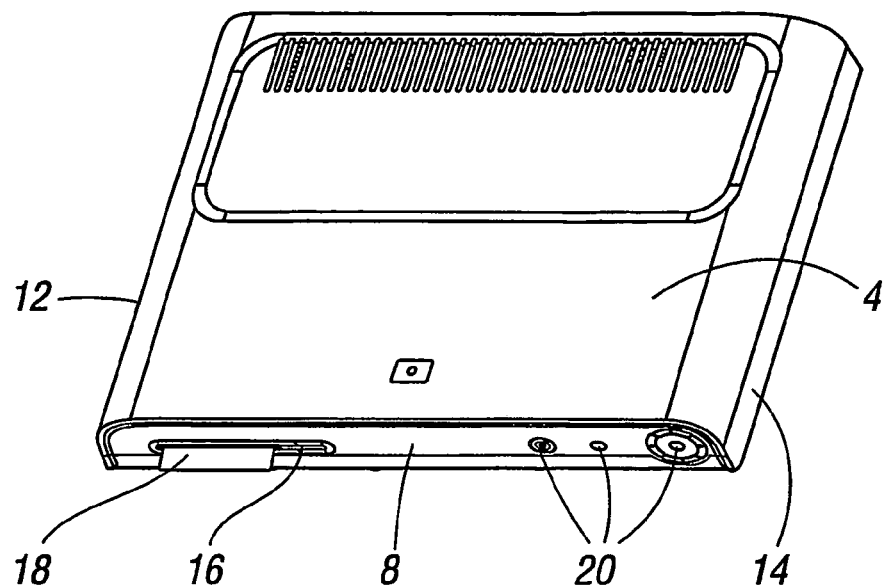
Figure 6:
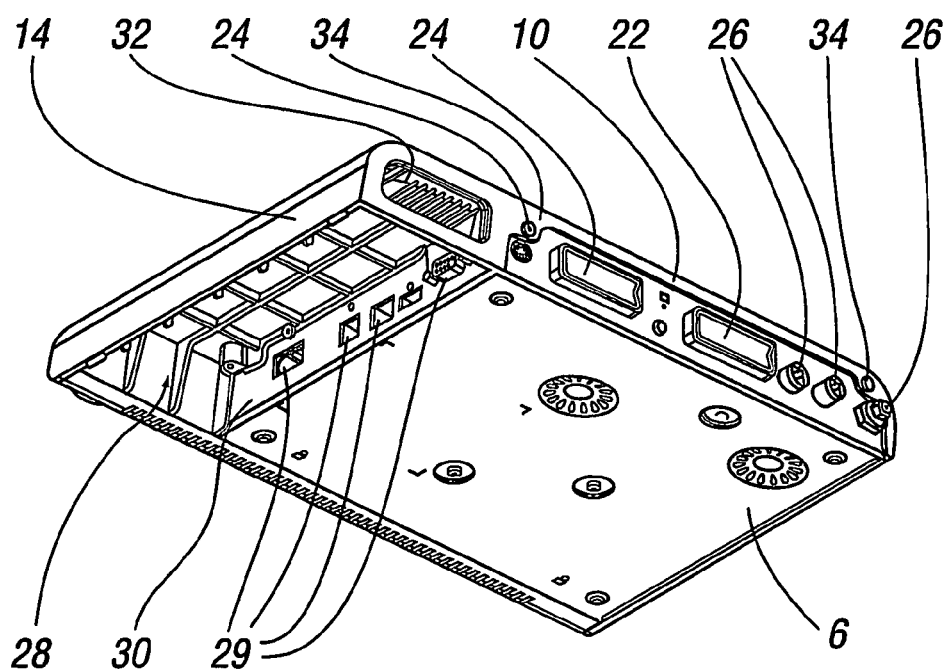

An embodiment of the present invention will now be described with reference to the accompanying figures, wherein:

FIG. 1 is an end view of the rear of the housing for a BDR;
FIG. 2 is a plan view of the top of the housing in FIG. 1;
FIG. 3 is an end view of the front of the housing in FIG. 1;
FIG. 4 is a side view of the housing in FIG. 1;
FIG. 5 is a perspective view of the housing in FIG. 1 from the front; and
FIG. 6 is a perspective view of the housing in FIG. 1 from the bottom.

Referring to the figures, there is illustrated a housing 2 for a broadcast data receiver (BDR). The housing 2 has a top wall 4, a bottom wall 6, a front end panel 8, a rear end panel 10 and side walls 12, 14. The electrical components for the BDR are contained within the housing.

The front panel 8 is provided with a slot 16 for the location of a smart card 18 therein and a plurality of buttons 20 to allow a user to control one or more functions of the BDR.

The rear panel 10 is provided with a number of connection means in the form of SCART connector sockets 22, 24 for connection with electrical cables with SCART plugs on at least one end thereof, and electrical sockets 26 for connection with electrical cables having electrical plugs on at least one end thereof. The electrical cables (not shown) connected to the BDR at one end thereof typically connect to other items of electrical apparatus, cable or telephone network and/or to an electrical power supply at the other end thereof.

The dimensions of the BDR have been reduced to provide a more sleek and compact item of apparatus. As such, there is insufficient space on the rear panel of the housing for all the electrical connections. In order to overcome this problem further electrical connections 29 are provided along an internal side wall 30 of the housing. However, location of additional electrical cable connections along a side wall of the housing would normally detract from the aesthetic appearance of the housing. Thus, in accordance with the present invention, the housing 2 is provided with a channel portion 28, as shown in FIG. 6.

Channel portion 28 is provided adjacent side wall 30 and is integrally formed with the housing, defined by side wall 14, part of front panel 8, part of rear panel 10 and interior side wall 29. In this example, no base is provided with the channel portion since the surface on which the BDR is located in use will typically act as a base for the channel portion. However, a base can be provided with the channel portion if required.

An aperture 32 is provided in the rear panel 10 adjacent channel portion 28 to enable the electrical cables and plugs on the ends of the electrical cables to be inserted therethrough for connection with the further electrical connections 29. As such, it will be appreciated by the reader that at least a part of the electrical cable and connection end is hidden from view via the channel portion 28. The cavity forming the channel portion defined by the walls of the housing also allows excess cable to be stored therein.

In the illustrated example, the housing typically includes two parts; a first part comprising the channel portion 28, top 4, front panel 8, a portion of the rear panel 10 and side walls 12, 14, and a second part comprising the remainder of the rear panel 10 and bottom wall 6, which are joined together by a plurality of fixing screws 34. However, the housing can be included as a single integrally formed unit and/or the channel portion can be attached thereto. A channel portion can also be provided adjacent the rear panel 10 if required.

Thus, the resulting item of electrical apparatus is compact whilst providing an improved aesthetic appearance by hiding at least some of the electrical connectors and/or at least a part of electrical cables connected thereto.

The invention claimed is:

1. A broadcast data receiver apparatus comprising:
a housing for containing one or more components therein, the housing having:
a housing top wall, a housing bottom wall, a housing front wall, a housing rear wall with at least one rear connector to allow connection of at least one rear cable thereto, and at least one housing side wall with at least one side connector to allow connection of at least one side cable thereto;
a detachable channel portion being provided adjacent to and covering the at least one side connector and for containing at least part of the at least one side cable;
said channel portion including a channel side wall opposite the housing side wall, a channel top wall extending from the housing side wall to the channel side wall, and a channel end wall defining an aperture;
said aperture being positioned in a plane that is substantially transverse to the housing side wall and through which a cable can exit or enter to connect to at least one side connector;
wherein the apparatus has the external appearance of a broadcast data receiver when the channel portion is not detached from the housing;
wherein the housing rear wall is substantially perpendicular to the channel side wall; and
wherein the channel portion is detachably attached to the housing, wherein the channel end wall connects to the housing rear wall and to the at least one of the housing side walls, and wherein the channel end wall includes at least one aperture or recess to allow the at least part of the at least one side cable to enter or exit the channel portion.

2. Apparatus according to claim 1 wherein the channel portion is integrally formed with the housing.

3. Apparatus according to claim 1 wherein at least one channel connector is provided to attach the channel portion to the housing, the at least one channel connector includes any or any combination of adhesive, welding, screws, nuts, bolts, clips and complementary engagers.

4. Apparatus according to claim 1 wherein one or more walls of the channel portion are substantially flush with one or more walls of the housing.

5. Apparatus according to claim 1 wherein one or more apertures are provided in the channel portion.

6. Apparatus according to claim 1 wherein the housing is provided in two or more parts and the channel portion is attached to or formed in at least one of the housing parts.

7. A channel portion for attachment to the housing of the apparatus according to claim 1, the channel portion comprising:
   the channel side wall in spaced relation from the at least one housing side wall; and
   the channel end wall extending from the channel side wall towards the at least one housing side wall, the channel end wall including at least one aperture through which the at least one side cable can enter or exit the channel portion.

8. Apparatus according to claim 1 wherein the at least one housing side wall includes a first housing side wall and a second housing side wall, the housing top wall and the housing bottom wall are in spaced relation from one another, the housing front wall and the housing rear wall are in spaced relation from one another, and the first housing side wall and the second housing side wall are in spaced relation from one another.

9. Apparatus according to claim 1 wherein the housing rear wall is substantially perpendicular to the at least one of the housing side walls.

10. An apparatus according to claim 1 wherein the channel portion includes an absence of a wall opposite the channel top wall.

11. Apparatus according to claim 1 wherein the channel end wall is substantially parallel to the housing rear wall.

12. An apparatus according to claim 1
   wherein the channel side wall is in spaced relation from the at least one housing side wall and defining to define the channel portion therebetween.

* * * * *